United States Patent [19]

Micklethwaite

[11] 4,374,684
[45] Feb. 22, 1983

[54] HEAT TREATMENT OF CADMIUM MERCURY TELLURIDE

[75] Inventor: William F. H. Micklethwaite, Rossland, Canada

[73] Assignee: Cominco Ltd., Vancouver, Canada

[21] Appl. No.: 226,291

[22] Filed: Jan. 19, 1981

[30] Foreign Application Priority Data

Jul. 18, 1980 [CA] Canada ................................. 356569

[51] Int. Cl.³ .............................................. C22F 1/02
[52] U.S. Cl. ................................... 148/13.1; 148/20.3
[58] Field of Search ....................... 148/13.1, 20.3, 1.5

[56] References Cited

U.S. PATENT DOCUMENTS 3,963,540  6/1976  Camp et al. ...................... 148/20.3

Primary Examiner—R. Dean
Attorney, Agent, or Firm—Arne I. Fors; Robert F. Delbridge

[57] ABSTRACT

A method for the heat treatment of cadmium mercury telluride homogeneous single crystals is disclosed wherein the crystals are heated and maintained at a temperature in the range of from about 300 K to below the solidus temperature of the composition treated in the presence of mercury, the vapor pressure of mercury being less than the saturation vapor pressure of mercury.

7 Claims, No Drawings

HEAT TREATMENT OF CADMIUM MERCURY TELLURIDE

BACKGROUND OF THE INVENTION

This invention relates to heat treatment of cadmium mercury telluride and, more particularly, relates to heat treatment of homogeneous single crystals of cadmium mercury telluride to improve and impart desired characteristics.

Cadmium mercury telluride, hereinafter referred to as CMT, is a pseudobinary compound with compositions represented by the general formula $(Cd_xHg_{1-x})_yTe_{1-y}$, wherein x has values between zero and one and y has values between 0.49 and 0.51. Homogeneous single crystals of CMT may be prepared by any one of a number of methods. To correct defects such as vacancies or dislocations in the crystal lattice and to eliminate compositional gradients, and to make p-n type conversions, this CMT single crystal material is usually subjected to a heat treatment or annealing process in the presence of mercury and sometimes in the presence of mercury and one or more of the other CMT constituent elements.

According to U.S. Pat. No. 3,468,363, which issued on Sept. 23, 1969, ingots of CMT are prepared and annealed at 300 degrees C. for one hour under a partial mercury vapor pressure of 150 mm. No information is provided on the Hg source. According to U.S. Pat. No. 3,514,347, which issued on May 26, 1970, CMT is subjected to thermal treatments to obtain n-type material or to achieve p-n type conversion. The heat treatments are carried out at specified temperatures and low pressures of mercury. It is stated that the source of mercury vapor is placed in a zone cooler than the CMT, i.e., a temperature gradient exists.

According to U.S. Pat. No. 3,723,190, which issued on Mar. 27, 1973, CMT is annealed under mercury vapor obtained from a source of excess mercury while a temperature gradient between the CMT and the mercury source is maintained. The mercury pressure exceeds the "intrinsic line" shown. According to U.S. Pat. No. 3,725,135, which issued on Apr. 3, 1973, epitaxial layers of CMT are subjected to an isothermal heat treatment at 300 degrees C. at a mercury pressure of added mercury of 115 mm. This disclosure is silent on the nature and the temperature of the source of mercury and the temperature of the isothermal heat treatment can, therefore, only relate to the temperature of the epitaxial layer of CMT.

According to U.S. Pat. No. 3,954,518, which issued on May 4, 1976, CMT is annealed at a temperature below the solidus temperature while a constituent vapor pressure lower than the equivalent vapor pressure of the constituents of the CMT is maintained. The mercury pressure is kept low by controlling the mercury temperature below the temperature of the CMT. Thus, a temperature gradient is used. According to U.S. Pat. No. 3,963,540, which issued on June 15, 1976, CMT material is prepared and subsequently annealed at a temperature near but below the solidus temperature in the presence of excess constituents, giving an excess of mercury vapor alone or an excess of mercury, cadmium and tellurium vapors combined.

According to U.S. Pat. No. 3,979,232, which issued on Sept. 7, 1976, CMT is isothermally annealed in the presence of an excess mercury vapor and cadmium vapor from a source of excess mercury and a source of excess cadmium, while a tellurium vapor source may also be present. According to U.S. Pat. No. 4,028,145, which issued on June 7, 1977, CMT is annealed isothermally in the presence of excess cadmium vapor. According to U.S. Pat. No. 4,116,725, which issued on Sept. 26, 1978, CMT is annealed in presence of excess mercury and tellurium using a temperature gradient between the CMT and the mercury and tellurium.

Thus, the prior art discloses two basic methods for the heat treatment of CMT in the presence of one or more constituents of CMT. The first method generally comprises heat treatment of CMT using a differential temperature or temperature gradient, whereby the CMT is at one temperature and the source(s) of added constituent(s) is (are) at a second temperature. The vapor pressure(s) of the constituent(s) in this method is (are) usually less than the saturation pressure of the constituent(s) at the temperature of the CMT. The second method generally comprises heat treatment of CMT under isothermal conditions and a constituent pressure equal to the saturation pressure at the isothermal temperature. Both these methods require an excess amount of constituent(s) to be present at all times during the heat treatment; such excess(es) being present as liquid(s) or solid(s) discrete from the CMT being treated.

However, some disclosures in the prior art are insufficient to determine the exact nature of the annealing method used. For example, it is stated in some cases that annealing is carried out with slices at a defined temperature and under a mercury vapor pressure below the mercury saturation pressure, but the temperature of the mercury source is not taught. Thus, in these cases, in order to obey Gibbs phase rule, the excess mercury must be present at a temperature which differs from the specified temperature, i.e., a temperature gradient is used. Conversely, in those cases wherein the annealing is carried out isothermally in the presence of an excess of constituent(s), it follows that the vapor pressure(s) of the constituent(s) is (are) equal to the saturation vapor pressure of the constituent(s) at the annealing temperature. The main disadvantage of the prior art processes, wherein an excess of constituent element(s) and, particularly, an excess of mercury is present during the heat treatment, is the scavenging by the excess mercury of CMT's constituent elements by dissolution of constituents from the CMT slices via the gas phase into or precipitation onto the excess of added constituent element, especially mercury.

STATEMENT OF INVENTION

I have now found that the heat treatment or annealing of CMT can be advantageously carried out in an isothermal system by maintaining the partial vapor pressure of added mercury below the saturation pressure of mercury at the annealing temperature. Thus, I have found that by isothermally annealing CMT single crystal material in a suitable container, which is maintained at a uniform annealing temperature in the range of between 300 K. and the solidus temperature of CMT, in the presence of mercury in gaseous form only at the annealing temperature, scavenging is reduced and the p-n type conversion is improved which results in better optoelectrical characteristics.

It is, therefore, an object of the present invention to provide a method for the heat treatment of CMT single crystal material to improve the modification of p-type characteristics, the p-n type conversion, crystal perfection and the opto-electrical characteristics. It is another object of the present invention to provide a method for the heat treatment of CMT single crystal material which method produces more uniformly reproducible opto-electrical characteristics than heretofore possible. These and other objects of the invention and the manner in which they can be attained will become apparent from the following detailed description of the method of the invention.

According to the invention, there is provided a method for the heat treatment of homogeneous single crystal cadmium mercury telluride which comprises the steps of placing slices of said cadmium mercury telluride, represented by the formula $(Cd_xHg_{1-x})_yTe_{1-y}$ wherein x has values between zero and one and y has values in the range of about 0.49 to 0.51, in an ampoule, placing in said ampoule a predetermined amount of mercury, evacuating and sealing the ampoule, heating the ampoule to a constant uniform temperature in the range of from about 300 K. to a temperature near but below the solidus temperature of said slices of cadmium mercury telluride, said predetermined amount of mercury being such that only vapor of said predetermined amount of mercury is present in the ampoule at said constant uniform temperature and the vapor pressure of mercury is less than the saturation vapor pressure of mercury at said constant uniform temperature, maintaining said constant uniform temperature for a period in the range of about 10 to 5000 hours and recovering treated slices.

CMT material having compositions represented by the general formula $(Cd_xHg_{1-x})_yTe_{1-y}$, wherein x has values between zero and one, usually in the range of about 0.14 to 0.60, and y has values in the range of about 0.49 to 0.51, can be prepared as homogeneous single crystals from electronic grade starting materials using one of a number of well established techniques. Ingots of single crystal CMT are cut into slices, which are submitted to a heat treatment to correct compositional gradients to remove vacancies or dislocations in the crystal lattice and to modify p-type or to convert between p-type and n-type material. The heat treatment is carried out by annealing slices at a constant temperature for a period of time in the presence of mercury in amount sufficient to give a vapor pressure of mercury which is less than the saturation pressure of mercury at the annealing temperature.

DESCRIPTION OF THE PREFERRED EMBODIMENT

According to the method of the invention, slices of homogeneous, single crystal CMT are carefully cleaned and placed in a suitable container, such as a glass ampoule, together with a predetermined amount of mercury. In charging the ampoule, it is advantageous to place the slices in one end and the mercury separate from the slices in the opposite end of the ampoule to avoid premature interaction. After placing slices and mercury in the ampoule, the ampoule is evacuated, sealed and heated in an annealing furnace, which is maintained isothermally at the desired constant, uniform annealing temperature. The ampoule is retained in the furnace under isothermal conditions for a period of time sufficient to achieve the desired degree of annealing. Upon completion of the annealing period, the ampoule is removed from the furnace, cooled and the annealed slices are removed from the ampoule.

The predetermined amount of mercury is calculated from the free space in the ampoule (i.e. the volume of the ampoule minus the volume occupied by the slices of CMT, the slice holders and any sacrificial source material), the annealing temperature and the desired mercury vapor pressure. The amount is determined such that the vapor pressure of the volatilized mercury is less than the saturation pressure of mercury at the annealing temperature. The vapor pressure of mercury is preferably maintained in the range of 0.30 to 0.99 times the saturation pressure of mercury at the annealing temperature. For example, if 10 mg mercury is required for a given size of the ampoule to achieve saturation pressure of mercury at the annealing temperature, 9 mg would be charged to achieve 90% saturation, which is within the desired range. It is noted that the amount of mercury required to achieve the desired reduction in metal vacancy concentration is typically $10^{-3}$ to $10^{-5}$ times the amount of mercury charged to the ampoule to achieve the desired partial saturation. This represents a negligible change in the saturation pressure due to absorption.

The annealing is conducted isothermally at a constant temperature which may be in the range of from about 300 K to a temperature just below the solidus temperature of CMT. The isothermal annealing temperature used is dependent on the composition of the CMT, i.e. the value of x, and the desired end product. For x values in the range of 0.14 to 0.60, the annealing temperature is maintained isothermally in the range of about 300 to 700 K., preferably at about 520 K.

The ampoule is maintained at the desired isothermal annealing temperature for a period of time sufficient to cause substantial re-equilibration of the desired elements in the slices by diffusion processes. Typically, the time should be sufficient to re-equilibrate at least 50% of the slice volume which requires up to 5000 hours. If desired, only the surface of the slices is annealed, which may require as little as 1 hour. Thus, the annealing time is in the range of about 1 to 5000 hours, typically in the range of about 50 to 2000 hours, preferably in the range of about 700 to 900 hours.

If desired, the annealing in the presence of added mercury may be carried out in the additional presence of at least one sacrificial source material which may reduce scavenging of CMT constituent elements from the surfaces of the CMT slices being treated by saturating the gas phase with respect to Cd and Te. Suitable sacrificial source materials are cadmium and tellurium in elemental form, amalgams of cadmium and mercury, amalgams or tellurium and mercury, and compounds such as mercury telluride, cadmium telluride and cadmium mercury telluride. The sacrificial source material may be added in the form of a chip or a powder when charging the ampoule and is preferably placed together with the mercury in the end of the ampoule opposite the end in which the slices are placed. When using the compounds mercury telluride, cadmium telluride and cadmium mercury telluride as sacrificial source material, these compounds are preferably added in finely divided form, for example, as a powder with a large specific surface area. The contribution to the partial vapor pressures of CMT constituent elements in the ampoule from the element or elements of the sacrificial source material at the annealing temperature, relative to the contribution from the constituent elements of the CMT slices, is roughly proportional to the surface area of the powdered material and the slices, respectively. When mercury is present in the sacrificial source material, the contribution of the mercury vapor pressure of the sacrificial source material to the total desired mercury vapor pressure in the ampoule at the annealing temperature must be taken into account when calculating the amount of mercury to be added as the element, in order to obtain mercury in gaseous form only at a mercury vapor pressure less than the saturation pressure of mercury at the annealing temperature.

Upon completion of the annealing, the ampoule is removed from the furnace and cooled to room temperature. After cooling, the annealed slices are removed from the ampoule. Care should be taken that no vapor of the originally added mercury and of any sacrificial source material, if present, condenses on the slices. Usually cooling of the ampoule in ambient conditions, i.e. at room temperature, causes vapor to condense on the wall of the ampoule. If desired, the ampoule may be partly removed from the furnace such that the portion of the ampoule which contains the slices is retained in the furnace for a few minutes which causes any condensation of vapors to take place in the cooler end of the ampoule away from the slices. The condensed mercury may be kept separated from the slices by a suitable constriction of the ampoule diameter near the end of the ampoule which is to be cooled first.

The method of annealing CMT as described above has a number of advantages. The method results in much more uniformly reproducible quality of CMT slices. The metal non-metal balance in the CMT is adjusted resulting in a reduction of native defect acceptors. By having the mercury present entirely in the gaseous form during annealing, loss of constituent elements from the CMT slices is drastically reduced. The opto-electrical characteristics are improved, the carrier mobility is increased and the free carrier concentration and resistivity are reduced. The isothermal conditions in the ampoule provide a uniform slice temperature and easy process control. The reduction of scavenging and the easier temperature control make it possible to use large size ampoules (able to hold up to 60 slices), which in turn fosters economics of scale and results in the production of annealed slices with more uniform opto-electrical characteristics. For example, CMT slices with $X=0.2$ having a free carrier concentration of $3\times 10^{14}/cm^3$ can be consistently produced. The annealing in the presence of sacrificial source material may result in a further reduction of the degradation of the slice surface by reducing scavenging from the CMT slices.

The invention will now be illustrated by means of the following non-limitative examples.

EXAMPLE 1

This example illustrates the scavenging of constituent elements of CMT by excess added mercury which is present during heat treatment of CMT slices in a system wherein a temperature gradient is maintained. A large number of tests were done wherein three series of CMT slices were given a heat treatment in evacuated closed ampoules in the presence of (a) 100 mg mercury, (b) 100 mg mercury and 100 mg tellurium, and (c) 100 mg mercury, 100 mg tellurium and 100 mg powdered CMT. The slices were maintained at 250 degrees C. and the added material was maintained at 245 degrees C. for a period of 10 weeks. Upon completion of the annealing period the ampoules were cooled and opened, and the excess mercury analyzed for cadmium and tellurium. The analysis results showing the ranges of cadmium and tellurium in the added mercury are given in Table I.

TABLE 1

| Test Series | Cd* in μg | Te* in μg |
|---|---|---|
| a | 0.1–0.2 | 50–300 |
| b | 0.2–2.0 | 10–3000 |
| c | 0.2–60 | 50–3000 |

*contained in the 100 mg mercury after the heat treatment.

It can be seen from these results that the added excess mercury picked up substantial amounts of cadmium and tellurium. The presence of additional tellurium and powdered CMT had little effect on the lower values in the ranges of results of series a, b and c as the results overlap, but extended the ranges upwardly to much higher levels.

In test series a, the amounts of cadmium and tellurium in the excess mercury represent direct losses of cadmium and tellurium from the slices. For a typical charge of 15 slices, a loss from the slices of 3 μg Cd and 30 μg Te represents $1.6\times 10^{16}$ and $1.5\times 10^{17}$ carriers/cm$^3$, respectively.

EXAMPLE 2

This example illustrates that the amount of cadmium and tellurium in added mercury is substantially reduced when CMT slices are annealed in an isothermal system in the presence of a very small amount of added mercury which gives a vapor pressure of mercury during the annealing period less than its saturation vapor pressure at the annealing temperature.

CMT slices and 2 μg Hg were charged into and placed in the opposite ends of each one of a number of ampoules. The ampoules were evacuated, sealed and placed in a constant temperature furnace. The ampoules were maintained in the furnace for 10 weeks at a constant uniform temperature of 250 degrees C. The mercury vapor pressure during the heat treatment was calculated to be 40% of the saturation vapor pressure. Upon completion of the annealing the ampoules were removed from the furnace and cooled. Mercury condensed on the ampoules wall and was analyzed. The condensed mercury for each ampoule was found to contain 0.06 μg Cd and 0.6 μg Te. These amounts of cadmium and tellurium represent $2.5\times 10^{14}$ and $2.3\times 10^{15}$ carriers/cm$^3$, respectively, for a typical ampoule charge of 20 slices. It is noted that these amounts of cadmium and tellurium, although evolved from the slices, are not removed from the gas phase during annealing but only upon cooling when annealing is completed.

EXAMPLE 3

This example illustrates the improvements in characteristics of CMT that can be attained when CMT is annealed according to the method of the invention are compared to the characteristics of CMT annealed in a system wherein an excess of mercury is present. This example also illustrates that the characteristics of CMT, which has been annealed with a temperature gradient in presence of excess added mercury, can be much improved by re-annealing such CMT isothermally according to the method of the invention.

An ingot of single crystal CMT ($X=0.205$) was cut into slices. Two slices were placed in Ampoule A and submitted to an isothermal heat treatment according to the method of the invention. The treatment was carried out by annealing the slices at 250 degrees C. for 840 hours in the presence of mercury vapor only and at a vapor pressure equal to 90% of the value of the saturation vapor pressure of mercury at 250 degrees C.

A group of nine slices were placed in Ampoule B and annealed with a temperature gradient for 840 hours in the presence of an added excess of mercury. The slices were maintained at 250 degrees C. and the excess mercury at 240 degrees C. A third group of twelve slices were annealed in Ampoule C in another furnace using the same conditions as those used for Ampoule B.

Upon completion of the heat treatment, the slices were removed from the ampoules and the resistivity, the mobility and the free carrier concentration were determined at 77 K.

Four annealed slices from each of the Ampoules B and C were subsequently re-annealed in Ampoule D under isothermal conditions at 250 degrees C. for 336 hours in the presence of mercury vapor only and at a vapor pressure equal to 90% of the value of the saturation vapor pressure of mercury at 250 degrees C. Upon completion of the heat treatment, the resistivity, the mobility and the free carrier concentration were again determined.

The test results are tabulated in Table II.

TABLE II

| Characteristic Ampoule | Resistivity in ohm cm $\times 10^{-1}$ | | | | Mobility in $cm^2/V \cdot sec \times 10^5$ | | | | Carriers per $cm^3$ $\times 10^{14}$ | | | |
|---|---|---|---|---|---|---|---|---|---|---|---|---|
| Slice # | A | B | C | D | A | B | C | D | A | B | C | D |
| 10 |  | 1.1 |  | 1.0 |  | 1.7 |  | 1.9 |  | 3.3 |  | 3.2 |
| 11 |  |  | 1.1 |  |  |  | 1.8 |  |  |  | 3.1 |  |
| 12 |  | 1.2 |  |  |  | 1.8 |  |  |  | 2.9 |  |  |
| 13 |  |  | 1.0 |  |  |  | 1.9 |  |  |  | 3.3 |  |
| 14 |  | 1.5 |  |  |  | 1.4 |  |  |  | 3.0 |  |  |
| 15 |  | 1.1 |  | 1.0 |  | 1.7 |  | 1.8 |  | 3.4 |  | 3.5 |
| 16 |  | 1.9 |  |  |  | 1.2 |  |  |  | 2.9 |  |  |
| 17 |  |  | 1.1 |  |  |  | 1.7 |  |  |  | 3.6 |  |
| 18 |  | 2.7 |  |  |  | 0.74 |  |  |  | 3.1 |  |  |
| 19 | 0.93 |  |  |  | 1.7 |  |  |  | 4.0 |  |  |  |
| 20 |  | 3.9 |  | 0.87 |  | 0.48 |  | 1.8 |  | 3.4 |  | 4.0 |
| 21 |  |  | 0.95 |  |  |  | 1.7 |  |  |  | 3.8 |  |
| 22 |  | 6.9 |  |  |  | 0.21 |  |  |  | 4.3 |  |  |
| 23 |  |  | 0.97 |  |  |  | 1.7 |  |  |  | 3.9 |  |
| 24 |  | 12.0 |  | 0.89 |  | 0.06 |  | 1.7 |  | 8.0 |  | 4.2 |
| 25 |  |  | 1.0 | 0.71 |  |  | 1.7 | 1.9 |  |  | 3.7 | 4.7 |
| 26 |  |  | 1.1 |  |  |  | 1.5 |  |  |  | 3.8 |  |
| 27 |  |  | 1.5 |  |  |  | 1.2 |  |  |  | 3.6 |  |
| 28 |  |  | 2.8 | 0.64 |  |  | 0.76 | 2.1 |  |  | 3.0 | 4.7 |
| 29 | 0.61 |  |  |  | 2.0 |  |  |  | 5.2 |  |  |  |
| 30 |  | 8.9 |  | 0.57 |  | 0.07 |  | 2.0 |  | 10.0 |  | 5.3 |
| 31 |  |  | 2.6 | 0.59 |  |  | 0.63 | 2.0 |  |  | 3.8 | 5.2 |
| 32 |  |  | 3.8 |  |  |  | 0.39 |  |  |  | 4.2 |  |

It can be seen from the data presented in Table II that a wide variation exists in the value of the characteristics of slices from Ampoules B and C, not only between slices annealed in the same ampoule but also between the groups of slices annealed in the two ampoules; the results are inconsistent and not reproducible. The data also show that slices in the ampoules B and C positioned farthest away from the source of excess mercury (slices with the higher numbers, see column 1 of Table II), have poorer characteristics, i.e. a higher resistivity and a lower mobility, than those closer to the excess mercury.

The re-annealed slices from Ampoule D possess much more consistent characteristics, which are better in all cases than those of their precursors from Ampoules B and C. The characteristics of the isothermally re-annealed slices from Ampoule D are much improved over the characteristics of the slices from Ampoules B and C, are more consistent and are comparable to the characteristics of the slices from Ampoule A. The very similar values of the characteristics of slices from Ampoule A and Ampoule D also show that isothermal annealing in presence of mercury vapor only at less than saturation pressure gives reproducible results.

Finally, the characteristics of slices annealed in the presence of an excess of added mercury can be redeemed by an isothermal anneal in presence of mercury vapor only, at less than saturation pressure at the annealing temperature.

It will be understood of course that modifications can be made in the embodiment of the invention illustrated and described herein without departing from the scope and purview of the invention as defined by the appended claims.

What we claim as new and desire to protect by Letters Patent of the United States is:

1. A method for the heat treatment of homogeneous single crystal cadmium mercury telluride represented by the formula $(Cd_xHg_{1-x})_yTe_{1-y}$ wherein x has values between zero and one and y has values in the range of about 0.49 to 0.51 in an ampoule, comprising the steps of placing in said ampoule slices of said cadmium mercury telluride and a predetermined amount of mercury, evacuating and sealing the ampoule, heating the ampoule to a constant uniform temperature in the range of from about 300 K. to a temperature near but below the solidus temperature of said slices of cadmium mercury telluride, said predetermined amount of mercury being such that only vapor of said predetermined amount of mercury is present in the ampoule at said constant uniform temperature and the vapor pressure of mercury is less than the saturation vapor pressure of mercury at said constant uniform temperature, maintaining said constant uniform temperature for a period in the range of about 1 to 5000 hours, and recovering treated slices.

2. A method as claimed in claim 1, wherein x has values in the range of about 0.14 to 0.60.

3. A method as claimed in claim 1, wherein the constant temperature is in the range of about 300 to 700 K.

4. A method as claimed in claim 1 or 2 or 3, wherein said temperature is maintained for a period of time in the range of about 50 to 2000 hours.

5. A method as claimed in claim 1, or 2 or 3, wherein the vapor pressure of mercury is in the range of about 0.30 to 0.99 times the saturation vapor pressure of mercury.

6. A method as claimed in claim 2, wherein the vapor pressure of mercury is in the range of about 0.30 to 0.99 times the saturation vapor pressure of mercury, the constant temperature is about 520 K. and said temperature is maintained for a period of time in the range of about 700 to 900 hours.

7. A method as claimed in claim 1, or 2 or 3, wherein in addition to said predetermined amount of mercury, at least one of a sacrificial source material chosen from cadmium, tellurium, amalgams of cadmium and mercury, amalgams of tellurium and mercury, mercury telluride, cadmium telluride and cadmium mercury telluride is present during the heat treatment and the vapor pressure of mercury is less than the saturation vapor pressure of mercury at said constant uniform temperature.

* * * * *